United States Patent [19]

Chihara

[11] 4,043,110
[45] Aug. 23, 1977

[54] ELECTRONIC TIMEPIECE BATTERY-POTENTIAL DETECTING CIRCUIT

[75] Inventor: Hiroyuki Chihara, Suwa, Japan

[73] Assignee: Kabushiki Kaisha Suwa Seikosha, Tokyo, Japan

[21] Appl. No.: 609,459

[22] Filed: Sept. 2, 1975

[30] Foreign Application Priority Data

Aug. 30, 1974 Japan .................................. 49-99576

[51] Int. Cl.² ......................... G04C 3/00; G08B 21/00
[52] U.S. Cl. .................................. 58/23 BA; 340/249
[58] Field of Search ............ 58/23 A, 23 BA; 317/31; 320/13, 14; 340/248 R, 248 A, 249

[56] References Cited

U.S. PATENT DOCUMENTS

| | | | |
|---|---|---|---|
| 3,383,522 | 5/1968 | Apfelbeck et al. | 340/248 B |
| 3,898,790 | 8/1975 | Takamune | 58/152 H |
| 3,912,977 | 10/1975 | Fillmore | 317/31 |
| 3,916,262 | 10/1975 | Easter | 317/31 |
| 3,991,553 | 11/1976 | Bergey et al. | 58/23 BA |
| 3,993,985 | 11/1976 | Chopard | 58/23 BA |

Primary Examiner—E. S. Jackmon
Attorney, Agent, or Firm—Blum, Moscovitz, Friedman & Kaplan

[57] ABSTRACT

An electronic timepiece battery-potential detecting circuit unaffected by temperature changes is provided. An electronic timepiece includes a DC power source such as a battery for providing an effective potential for energizing the timekeeping circuitry and display thereof. An electronic switching element is provided for detecting the effective potential of the DC power source. The electronic switching element includes a first electrode coupled to the power source for detecting the effective potential thereof, and two further electrodes defining a closed current path in response to the control electrode being referenced above a predetermined potential, the two further electrodes defining an open current path in response to the potential detected by the control electrode dropping to the predetermined potential, at least one of the further electrodes having a current temperature coefficient of substantially zero when the effective potential of the DC power source is above the predetermined potential.

38 Claims, 8 Drawing Figures

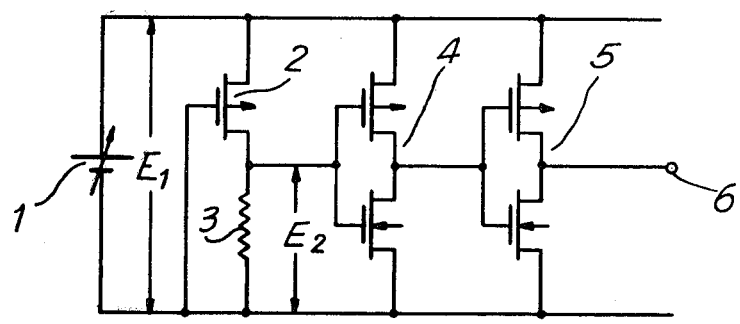
FIG. 1
FIG. 2
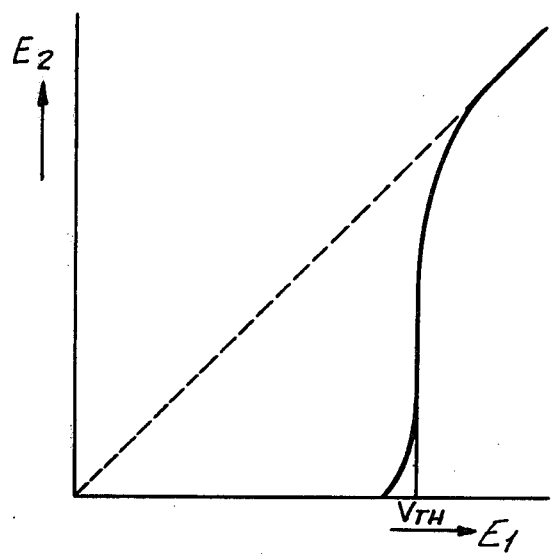
FIG. 8
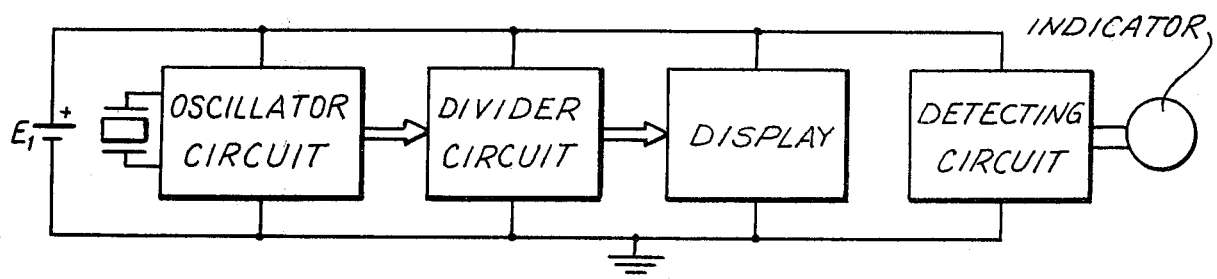

ELECTRONIC TIMEPIECE BATTERY-POTENTIAL DETECTING CIRCUIT

BACKGROUND OF THE INVENTION

This invention is directed to an electronic timepiece battery-potential detecting circuit, and in particular, to a battery-potential detecting circuit that is unaffected by changes in ambient temperature.

Battery-potential detecting circuits for detecting the effective potential of a battery utilized to drive the component elements of an electronic timepiece have taken on various forms. Once the DC battery drops below a specific potential, the battery will not only be incapable of providing a sufficient potential to energize the electronic timepiece, but moreover, the effective potential of the DC battery rapidly diminishes thereafter. Accordingly, battery-potential detecting circuits for indicating when the effective potential of the battery has dropped below a useful value have been provided. Nevertheless, such battery-potential detecting circuits have been particularly sensitive to changes in ambient temperature. Accordingly a battery-potential detecting circuit unaffected by changes in ambient temperature is desired.

SUMMARY OF THE INVENTION

Generally speaking, in accordance with the invention, an electronic timepiece battery-potential detecting circuit adapted to be unaffected by changes in ambient temperature is provided. The electronic timepiece includes an oscillator circuit for producing a high frequency time standard signal, a divider circuit for producing a low frequency timekeeping signal in response to the high frequency time standard signal and a display for displaying time in response to the timekeeping signals, the oscillator and divider circuits and display being energized by a DC power source producing an effective potential for such purpose. An electronic switching element for detecting the effective potential produced by the DC power source includes a first electrode coupled to the DC power source for detecting the voltage thereof. The electronic switching element includes two further electrodes adapted to define a closed circuit in response to the control electrode being reference above a predetermined potential and two further electrodes defining an open circuit in response to the effective potential detected by the control electrode dropping to the predetermined voltage, at least one of the further electrodes having a current temperature coefficient of substantially zero when the effective potential of the DC power source detected by the control electrode is above the predetermined potential.

Accordingly, it is an object of this invention to provide an improved electronic timepiece battery-potential detecting circuit that is not temperature dependent.

Still a further object of the invention is to provide an improved electronic timepiece battery-potential detecting circuit for indicating the drop of the potential of the battery below a predetermined potential.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is a detailed circuit diagram of a battery-voltage detecting circuit constructed in accordance with the instant invention;

FIG. 2 is a graphical comparison of the change in potential $E_2$ in response to a change in the potential $E_1$ of the circuit depicted in FIG. 1;

FIG. 8 is a block circuit diagram of an electronic timepiece including a battery-potential detecting circuit constructed in accordance with the instant invention.

DETAILED DESCRIPTION OF THE PREFERRED EMBODIMENTS

Figure 3:
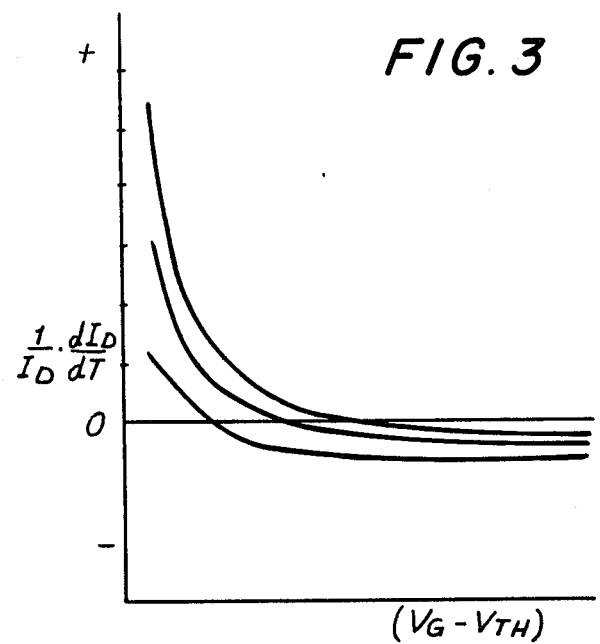
FIG. 3 is a graphical illustration of the changes in the drain electrode current temperature coefficient in response to an increase in the potential difference between the gate electrode and the threshold voltage of a P-MOS-FET.

Reference is now made to FIG. 8, wherein an electronic timepiece energized by a DC battery $E_1$ and including a battery-potential detecting circuit is depicted. The electronic timepiece includes an oscillator circuit including a high frequency time standard, such as a quartz crystal vibrator, for producing a high frequency time standard signal. A divider circuit comprised of a plurality of divider stages is adapted to receive the high frequency time standard signal and to divide same down to thereby produce a low frequency timekeeping signal representative of present time. A display, either digital or mechanical is coupled to the divider and in response to the time-keeping signal displays present time. Coupled to the battery utilized to energize the oscillator circuit, divider circuit and display is a DC battery-potential detecting circuit having an indicator coupled thereto. The indicator is adapted to provide an indication detectable by the user when the DC potential of the power source $E_1$ has dropped to a predetermined potential. It is understood that the indicator could be incorporated into the display of the timepiece if same were a digital display as a display element capable of being lit in response to an indicator signal being applied thereto.

The DC battery-potential detecting circuit is more particularly illustrated in FIG. 1, wherein the DC battery $E_1$ is depicted as a variable power supply 1 for facilitating explanation below. An enhancement type field effect transistor (P-MOS-FET) is coupled by the source electrode and gate electrode thereof across the variable potential $E_1$. The drain electrode of transistor 2 is coupled through resistor 3 to a reference potential. When transistor 2 is in a conductive state, the current path defined by the source and drain electrodes effects a potential drop across the resistor 3, which potential is a detecting potential $E_2$. Detecting potential $E_2$ is applied to two cascaded C-MOS inverter stages 4 and 5, which inverter stages effect respective inversions of the detecting voltage pulse at the output 6 of inverter stage 5. Accordingly, when the source and drain electrodes of the transistor 2 define an open current path, and the potential $E_2$ drops below the threshold potential required to effect operation of the respective inverter stages 4 and 5, an effective change in the binary state at the output terminal 6 occurs.

Referring to FIG. 2, the operation of the circuit depicted in FIG. 1 is explained as follows. When the effective potential of the DC battery 1 is above the threshold potential $V_{TH}$ of the P-MOS-FET transistor 2, the transistor is placed in a conductive state thereby effecting current flow through resistor 3 and hence rendering the detection voltage $E_2$ to be equal to the battery voltage $E_1$ as same changes. Nevertheless, as the battery potential $E_1$ approaches the threshold voltage $V_{TH}$, the detection voltage $E_2$ rapidly falls to a zero potential. Accordingly, when the detection voltage $E_2$ is at a voltage corresponding to $E_1$, namely, when the transistor 2 is in a conductive state, an effective input is applied to the cascaded C-MOS inverters and thereby produces a like binary output at the terminal 6 thereof. Nevertheless, as the battery voltage drops to the threshold voltage $V_{TH}$, the detection voltage $E_2$ rapidly drops to zero and hence below the threshold voltage of the inverters 4 and 5 and the output at 6 is changed to the opposite binary state, thereby providing an indication that the potential of the DC battery has dropped to or below a predetermined potential.

In a practical embodiment, the threshold voltage of the P-MOS-FET transistor is usually half the effective potential of the battery since such a transistor is formed on the same integrated circuit chip substrate as the complementary MOS transistor defining the C-MOS inverters. Moreover, it is noted that the relationship of the battery potential $E_1$ to the detection potential $E_2$ of the threshold voltage $V_{TH}$ is based on the magnitude of the resistance 3. Accordingly, if the slope of the $E_1$-$E_2$ curve depicted in FIG. 2 is to be reduced a likewise reduction in the load impedance 3 is required to render the detecting voltage $E_2$ 90 to 95 percent of the ordinary battery voltage. Nevertheless, as the impedance 3 is changed, the exact potential at which the transistor will be switched becomes less certain. However, since the detecting potential $E_2$, in order to effect a change in the state of the inverter 4, requires the voltage thereof to be in excess of the threshold voltage, it is easy to ascertain the detecting voltage even though difficulties are encountered in detecting the battery potential $E_1$.

Accordingly, by utilizing the P-MOS-FET transistor in a switching mode, whereby the threshold voltage of the transistor is utilized to detect a drop in the effective potential of a battery and hence an indication that the life of the battery is nearing completion, an effective detection circuit is provided. Nevertheless, the change in threshold voltage of the transistor caused by changes in ambient temperature can render the indication by the detection circuit to be inaccurate or invalid. Unless temperature compensation is taken into account in the battery-voltage detecting circuit, the possibility exists that an indication could be provided that the battery potential has dropped, when in fact no such drop has occurred or alternatively, that such detection circuit will not detect a drop in the effective potential of the battery when same does in fact drop. Accordingly, a feature of the instant invention is the improvement of the temperature characteristic of the battery-voltage detecting circuit characterized by improving the temperature characteristic of the MOS-FET transistor 2, which element contributes significantly to faulty detection of the battery-potential in response to changes in ambient temperatures.

Because the detection voltage $E_2$ is responsive to the drain current of the MOS-FET 2, the temperature characteristic of the drain current $I_D$ is important in determining the temperature characteristic of the detection circuit. The relationship between the temperature characteristic of the drain current $I_D$ of MOS-FET transistor 2 and the threshold voltage $V_{TH}$, when the drain voltage $V_D$ is maintained constant is as follows:

$$\frac{1}{I_D} \cdot \frac{dI_D}{dT} = \frac{1}{\mu n} \cdot \frac{d\mu n}{dT} + \left[ \frac{-1}{(V_G - V_{TH})} \cdot \frac{dV_{TH}}{dT} \right]$$

$$\frac{dV_{TH}}{dT} = \frac{d\phi F}{dT} \left[ 2 - \frac{1}{C_{ox}} \cdot \frac{QB}{2\phi F} \right]$$

wherein, $V_G$ is the gate to source voltage, hereinafter referred to as the "gate voltage,"

$\mu n$ is the mobility of electrons in the inversion layer.

$\phi F$ is the Fermi level inside the substrate.

$C_{ox}$ is the capacity per unit area of the oxide film.

$QB$ is the electric charge in the surface depletion layer.

As both $$\frac{d\mu n}{dT} \text{ and } \frac{dV_{TH}}{dT}$$

are negative values, the temperature dependency characteristic of the drain current $I_D$ of a MOS-FET can be rendered positive, negative or zero by suitably selecting the gate voltage-threshold voltage difference potential $(V_G - V_{TH})$ and the derivative of the threshold voltage $$\frac{dV_{TH}}{dT}.$$

Accordingly, the relationship between the gate-threshold difference potential $(V_G - V_{TH})$ and the drain current $I_D$ temperature coefficient is graphically illustrated in FIG. 3, which figure illustrates the variation of the drain current temperature coefficient in response to the gate-threshold voltage difference potential when the derivative of the threshold voltage is considered as a parameter. The instant invention is directed to rendering the temperature-dependency characteristic of the drain current $I_D$ to be substantially zero under certain operating conditions of the circuit to thereby improve the temperature characteristic and hence operation of the battery-potential detecting circuit. Specifically, the temperature dependency characteristic of the drain current of the detection MOS-FET transistor is substantially zero over a range of gate voltages supplied between the gate and source electrodes of the MOS-FET, and in particular over the range that the battery-potential is substantially within its operating range and above the predetermined detecting potential, which potential has a magnitude sufficient to effect an inversion of the outputs of the inverter stages 4 and 5. Although it is preferable for the temperature dependency characteristic to be zero for all potentials produced by the battery above the detecting voltage, improved results are achieved by at least insuring that the temperature dependency characteristic of the detecting transistor is zero at a voltage between about the supply voltage at which the battery is rated to operate and about the detecting voltage so that the temperature dependency characteristic is substantially zero between said rated and detecting voltages.

In the embodiment of the circuit depicted in FIG. 1, when the effective battery potential is 1.58V and the predetermined detecting voltage is 1.50V, the threshold voltage or the temperature coefficient of the threshold voltage having a preferred value can be obtained when the integrated circuit chip including the MOS-FET transistor is produced. Accordingly, a transistor having a drain current temperature coefficient of zero over the potential range of 1.50V to 1.58V would be preferred. As noted above, because the threshold voltage of a MOS-FET transistor is affected by the substrate, electrodes, oxide material and the like utilized to fabricate same, including the impurity concentration of the substrate and the thickness of the outside film, each of these constituent elements must be strictly controlled in order to obtain a zero temperature coefficient over a predetermined potential range.

Figure 4:
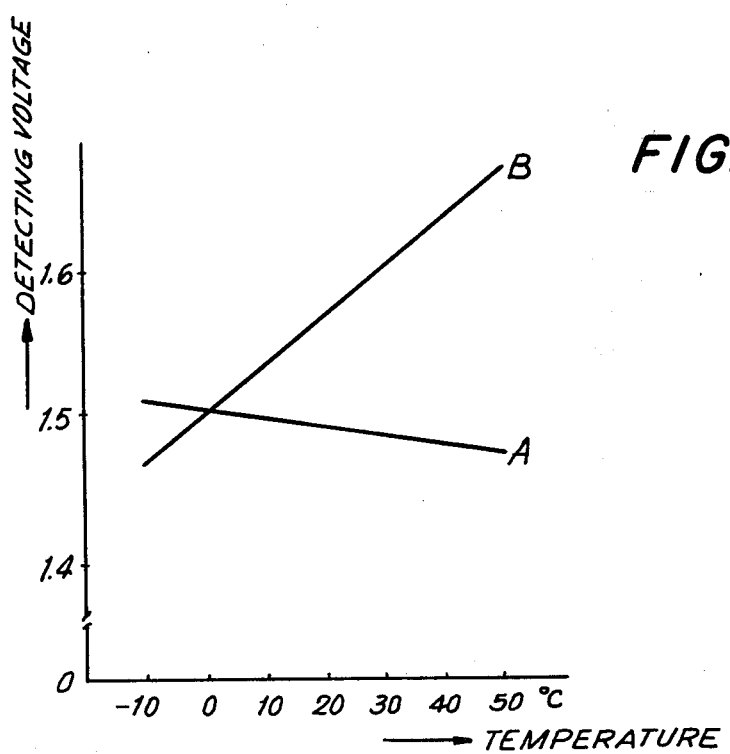
FIG. 4 is a graphical illustration of the threshold voltages of two distinct P-MOS-FET transistors in response to changes in ambient temperature.

Referring specifically to FIG. 4, a graphical illustration of the change in the detecting voltage in response to changes in ambient temperature of two different MOS-FETS in the first stage of the battery-potential detecting circuit illustrated in FIG. 1 is depicted. The MOS-FET transistor represented by the line A is a P-MOS-FET having a temperature coefficient of zero when the gate voltage is 1.55V, whereas line B represents the temperature characteristic of a MOS-FET wherein the temperature coefficient is zero for the drain current when the gate voltage is referenced at 1.1 V. Thus, for the actual embodiment discussed above, wherein the effective operating potential of the battery is 1.58 V, the predetermined detecting potential is about 1.50 V, which voltage refers to the potential at which a change of state in the output of the inverter circuits 4 and 5 is effected, FIG. 4 illustrates the variation in the detecting voltage as the ambient temperature rises from 10° to 50° C. Specifically, the temperature characteristic of the transistor A causes a 35 mv change over the temperature range, whereas the transistor B has a 190 mv change over the same temperature range, the significant difference in the range over which the voltage is changed in response to a change in ambient temperature demonstrating the significance of minimizing the temperature dependency characteristic of the first stage of the detection circuit.

Figure 5:
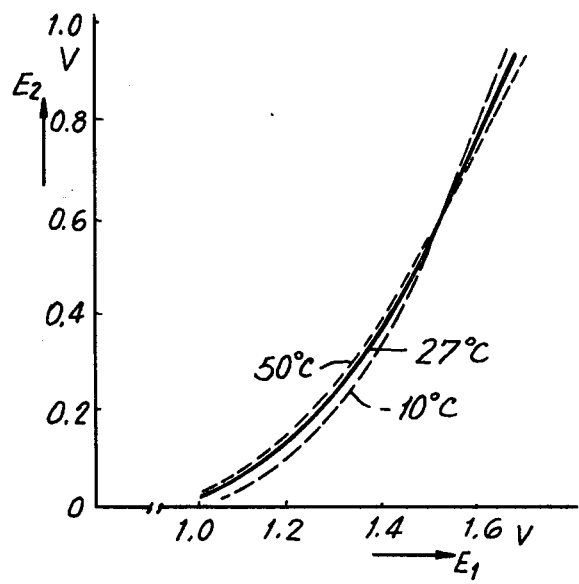
FIG. 5 is a graphical illustration of the change in the potential $E_2$ as a change in potential $E_1$ is effected when the P-MOS-FET depicted as A in FIG. 4 is utilized in the battery-potential detecting circuit depicted in FIG. 1.
Figure 6:
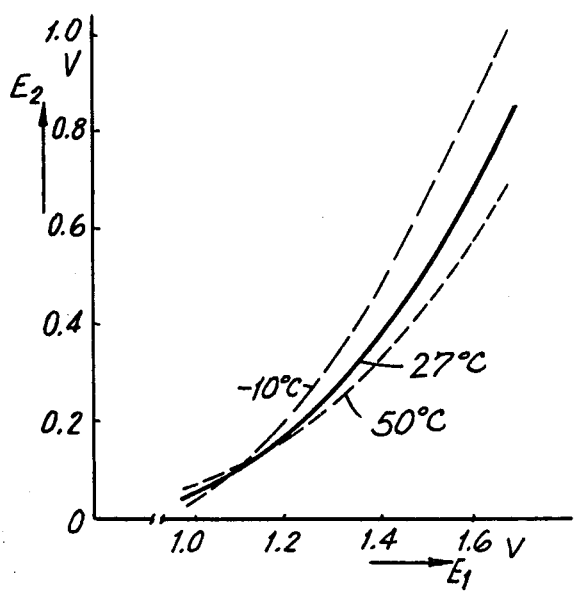
FIG. 6 is a graphical illustration of the changes in the potential $E_2$ with respect to changes in the potential $E_1$ when the P-MOS-FET transistor charactered as B in FIG. 4 is utilized in the battery-potential detecting circuit depicted in FIG. 1.

FIG. 5 illustrates the relationship between the output detecting potential $E_2$ and the DC battery potential $E_1$ when the transistor of line A depicted in FIG. 4 is utilized in the battery-detecting circuit depicted in FIG. 1. Similarly, FIG. 6 illustrates a comparison of the output detecting potential $E_2$ with respect to changes in the potential of the DC battery $E_1$ when a transistor having the temperature characteristic depicted by line B in FIG. 4 is utilized. FIG. 5 illustrates that the P-MOS-FET transistor represented by line A in FIG. 4 does not vary in response to variations in the temperature when the DC supply potential $E_1$ is at 1.5 volts. Alternatively, FIG. 6 illustrates a considerable variation in the output detection potential $E_2$ at the same DC battery input potential $E_1$ of 1.5 volts, again illustrating the significance of the instant invention.

Accordingly, in a preferred embodiment, a MOS-FET transistor is selected wherein the temperature coefficient of the drain current is zero over the entire range defined by the effective potential at which the DC battery operates and the detection voltage potential at which an indication by the detection circuit is provided. Nevertheless, an improved battery-potential detecting circuit is provided by providing the first stage detection transistor with a drain current temperature coefficient of zero at at least one potential within the range between about said output detection potential and about the potential at which the DC battery is effectively referenced.

Figure 7:
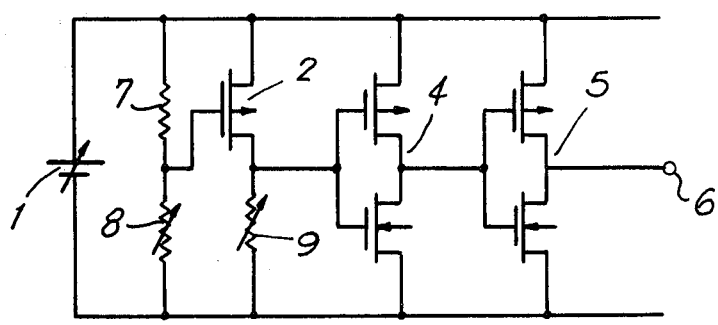
FIG. 7 is a detailed circuit diagram of a battery-voltage detecting circuit constructed in accordance with an alternate embodiment of the instant invention.

Reference is now made to FIG. 7 wherein a battery-potential detecting circuit constructed in accordance with an alternate embodiment of the instant invention for providing a drain current temperature coefficient of zero by changing the gate voltage is depicted. The detection circuit depicted in FIG. 7 is particularly adapted for use when the first stage detecting transistor 2 has a drain current temperature coefficient of zero at a potential lower than the operating potential of the DC battery. Accordingly, the gate electrode of the MOS-FET transistor 2 is coupled to the DC battery potential $E_1$ through a voltage divider circuit comprised of fixed resistor 7 and variable resistor 8. Additionally, the load impedance for determining the output detection potential $E_2$ is controlled by a variable resistor 9. In operation, the effective gate impedance is varied by varying resistor 8 to thereby change the voltage at which the drain current temperature coefficient is zero for the transistor 2 to be within the range between the operating potential of the DC battery and the predetermined detecting potential. Thereafter, a variable input potential is applied and variable resistor 9 is varied to select a potential approximate the threshold potential to effect an inversion of the output of the inverter stages 4 and 5 when the threshold voltage of the transistor is reached. It is noted that the instant invention utilizes a particular characteristic of a field effect transistor, namely, that the gate potential-threshold voltage difference potential at which the drain current temperature coefficient is zero can be utilized to provide an improved battery-voltage detection circuit which circuit remains uneffected by changes in ambient temperature. It is noted that the instant invention is not only directed to P-MOS-FET transistors, but is further adapted for use with N-MOS-FET transistors and junction type FET transistors. Moreover, the use of the zero drain current temperature coefficient characteristic of a MOS-FET can be utilized to particular advantage in the voltage comparison portion of an analog to digital converter, in thermometers and other instrumentation wherein measurements independent of changes in temperature are needed.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. In an electronic timepiece comprising oscillator means for producing a high frequency time standard signal, divider means for producing a low frequency timekeeping signal in response to said high frequency time standard signal, and display means for displaying time in response to the said timekeeping signal, the improvement comprising a DC power source for energizing said oscillator, divider and display means, said power source means being adapted to produce an effective voltage for such energizing, and electronic switching means for detecting the effective voltage produced by said power source means, said electronic switching means having a predetermined threshold voltage including a control electrode coupled to said power source for detecting the effective voltage thereof, and two further electrodes adapted to define a closed current circuit in response to said control electrode being referenced above a predetermined detecting voltage, said two further electrodes defining an open circuit in response to said control electrode detecting a drop in the effective potential of said power source below said predetermined detecting voltage, said control electrode being referenced to one of a voltage above and below said predetermined threshold voltage to define a current temperature coefficient of zero when the control electrode is referenced to a voltage above said predetermined detecting voltage.

2. An electronic timepiece as claimed in claim 1 and including further detection circuit means coupled to one of said further electrodes, said detection circuit means producing a first voltage level in response to said control electrode of said electronic switching means being referenced above said predetermined detecting voltage, and producing a second voltage level in response to said control electrode of said electronic switching means being referenced below said predetermined detecting voltage.

3. An electronic timepiece as claimed in claim 2, wherein said further detection circuit means includes first and second series-connected inverter circuits each having an input and an output, the input of the first inverter circuit being connected to said one further electrode, the first and second voltage levels being produced at the output of said second inverter circuit.

4. An electronic timepiece as claimed in claim 3, wherein each of said inverter circuits is formed of complementary-coupled MOS field effect transistors.

5. An electronic timepiece as claimed in claim 1, wherein said electronic switching means includes a MOS field effect transistor having a gate electrode corresponding to said control electrode and source and drain electrodes corresponding to said further electrodes, said MOS field effect transistor being selected to have a drain current having a temperature characteristic of substantially zero when said gate electrode is referenced to one of a voltage above and below said predetermined threshold voltage.

6. An electronic timepiece as claimed in claim 5, wherein said power source has a rated voltage, said MOS field effect transistor being coupled to have a drain current temperature coefficient of substantially zero in a range of voltages between at least said predetermined detecting voltage and said rated voltage.

7. An electronic timepiece as claimed in claim 6, wherein said power source produces a reference voltage, and including a load resistor connected intermediate said MOS transistor source-drain path and said reference voltage.

8. An electronic timepiece as recited in claim 7, wherein said load resistor is selectively variable.

9. An electronic timepiece as claimed in claim 1, including indication means coupled to one of said further electrodes for providing an indication to the user of the timepiece of the drop of the voltage of said power source below said predetermined detecting voltage.

10. In an electronic timepiece comprising oscillator means for producing a high frequency time standard signal, divider means for producing a low frequency timekeeping signal in response to said high frequency time standard signal, and display means for displaying time in response to said time-keeping signal, the improvement comprising a DC power source for energizing said oscillator, divider and display means, said power source being adapted to produce an effective voltage for such energizing; voltage divider means having an input coupled to said power source and an output at which a voltage appears equal to a fraction of the voltage produced by said power source as determined by said voltage divider means; and electronic switching means for detecting the fractional voltage produced at said voltage divider means output, said electronic switching means having a predetermined threshold voltage and including a control electrode coupled to said voltage divider means output for detecting said fractional voltage and two further electrodes adapted to define a closed current circuit in response to said control electrode being referenced above a predetermined detecting voltage, said two further electrodes defining an open circuit in response to said control electrode detecting a drop in the fractional voltage below said predetermined detecting voltage, said control electrode being referenced to one of a voltage above and below said predetermined threshold voltage to define a current temperature coefficient of zero when the control electrode is at a potential above said predetermined detecting voltage.

11. An electronic timepiece as claimed in claim 10, and including further detection circuit means coupled to one of said further electrodes, said detection circuit means producing a first voltage level in response to the fractional voltage being above said predetermined detecting voltage, and producing a second voltage level in response to said fractional voltage being below said predetermined detecting voltage.

12. An electronic timepiece as claimed in claim 11, wherein said further detection circuit means includes first and second series-connected inverter circuits each having an input and an output, the input of the first inverter circuit being connected to said one further electrode, the first and second voltage levels being produced at the output of said second inverter circuit.

13. An electronic timepiece as claimed in claim 12, wherein each of said inverter circuits is formed of complementary-coupled MOS field effect transistors.

14. An electronic timepiece as claimed in claim 10, wherein said electronic switching means includes an MOS field effect transistor having a gate electrode corresponding to said control electrode and source and drain electrodes corresponding to said further electrodes, said MOS field effect transistor being selected to have a drain current having a temperature characteristic of substantially zero when said gate electrode is referenced at a voltage above said predetermined detecting voltage.

15. An electronic timepiece as claimed in claim 14, wherein said power source has a rated voltage, said MOS field effect transistor being selected to have a drain current temperature coefficient of substantially zero in a range of voltages between at least said predetermined detecting voltage and a fraction of said rated voltage.

16. An electronic timepiece as claimed in claim 15, wherein said power source produces a reference voltage, and including a load resistor connected intermediate said MOS transistor source-drain path and said reference voltage.

17. An electronic timepiece as recited in claim 16, wherein said load resistor is selectively variable.

18. An electronic timepiece as claimed in claim 10, including indication means coupled to one of said further electrodes for providing an indication to the user of the timepiece of the drop of the voltage of said power source such that the voltage at the output of said voltage divider means falls below said predetermined detecting voltage.

19. An electronic timepiece as claimed in claim 10, wherein said voltage divider means includes means for selectively adjusting division ratio thereof and therefore the fraction of the power source voltage appearing at said voltage divider output.

20. In combination with a DC power source for producing an operable output voltage over an effective voltage range, means for detecting the impending failure of said power source including electronic switching means for detecting the effective voltage produced by said power source means, said electronic switching means having a predetermined threshold voltage including a control electrode coupled to said power source for detecting the effective voltage thereof, and two further electrodes adapted to define a closed current circuit in response to said control electrode being referenced above a predetermined detecting voltage, said two further electrodes defining an open circuit in response to said control electrode detecting a drop in the effective voltage of said power source below said predetermined detecting voltage, said control electrode being referenced to one of a voltage above and below said predetermined threshold voltage to define a current temperature coefficient of zero when the control electrode is at a voltage above said predetermined detecting voltage.

21. Power source failure detecting means as claimed in claim 20, and including further detection means coupled to one of said further electrodes, said detection circuit means producing a first voltage level in response to the control electrode of said switching means being referenced above said predetermined detecting voltage, and producing a second voltage level in response to said control electrode of said electronic switching means being referenced below said predetermined detecting voltage.

22. Power source failure detecting means as claimed in claim 21, wherein said further detection circuit means includes first and second series-connected inverter circuits each having an input and an output, the input of the first inverter circuit being connected to said one further electrode, the first and second voltage levels being produced at the output of said second inverter circuit.

23. Power source failure detecting means as claimed in claim 22, wherein each of said inverter circuits is formed of complementary-coupled MOS field effect transistors.

24. Power source failure detecting means as claimed in claim 20, wherein said electronic switching means includes a MOS field effect transistor having a gate electrode corresponding to said control electrode and source and drain electrodes corresponding to said further electrodes, said MOS field effect transistor being selected to have a drain current having a temperature characteristic of substantially zero when said gate electrode is referenced to one of a voltage above and below said predetermined threshold voltage.

25. Power source failure detecting means as claimed in claim 24, wherein said power source has a rated voltage, said MOS field effect transistor being coupled to have a drain current temperature coefficient of substantially zero in a range of voltages between at least said predetermined detecting voltage and said rated voltage.

26. Power source failure detecting means as claimed in claim 25, wherein said power source produces a reference voltage, and including a load resistor connected intermediate said MOS transistor source-drain path and said reference voltage.

27. Power source failure detecting means as claimed in claim 26, wherein said load resistor is selectively variable.

28. Power source failure detecting means as claimed in claim 20, including indication means coupled to one of said further electrodes for providing an indication to the user of the power source of the drop of the voltage of said power source below said predetermined detecting voltage.

29. In combination with a DC power source for producing an operative voltage over an effective voltage range, means for detecting the impending failure of said power source including voltage divider means having an input coupled to said power source and an output at which said voltage appears equal to a fraction of the voltage produced by said power source as determined by said voltage divider means; and electronic switching means for detecting the fractional voltage produced at said voltage divider means output, said electronic switching means having a predetermined threshold voltage including a control electrode coupled to said voltage divider means output for detecting said fractional voltage and two further electrodes adapted to define a closed current circuit in response to said control electrode being referenced above a predetermined detecting voltage, said two further electrodes defining an open circuit in response to said control electrode detecting a drop in the fractional voltage below said predetermined detecting voltage, said control electrode being referenced to one of a voltage above and below said predetermined threshold voltage to define a current temperature coefficient of zero when the control electrode is at a voltage above said predetermined detecting voltage.

30. Power source failure detecting means as claimed in claim 29, and including further detection circuit means coupled to one of said further electrodes, said detection circuit means producing a first voltage level in response to the control electrode of said electronic switching means being referenced above said predetermined detecting voltage, and producing a second voltage level in response to said control electrode of said electronic switching means being referenced below said predetermined detecting voltage.

31. Power source failure detecting means as claimed in claim 30, wherein said further detection circuit means includes first and second series-connected inverter circuits each having an input and an output, the input of the first inverter circuit being connected to said one further electrode, the first and second voltage levels being produced at the output of said second inverter circuit.

32. Power source failure detecting means as claimed in claim 31, wherein each of said inverter circuits is formed of complementary-coupled MOS field effect transistors.

33. Power source failure detecting means as claimed in claim 29, wherein said electronic switching means includes an MOS field effect transistor having a gate electrode corresponding to said control electrode and source and drain electrodes corresponding to said further electrodes, said MOS field effect transistor being selected to have a drain current having a temperature characteristic of substantially zero when said gate electrode is referenced at a voltage above said predetermined detecting voltage.

34. Power source failure detecting means as claimed in claim 33, wherein said power source has a rated voltage, said MOS field effect transistor being selected to have a drain current temperature coefficient of substantially zero in a range of voltages between at least said predetermined detecting voltage and a fraction of said rated voltage.

35. Power source failure detecting means as claimed in claim 34, wherein said power source produces a reference voltage, and including a load resistor connected intermediate said MOS transistor source-drain path and said reference voltage.

36. Power source failure detecting means as claimed in claim 35, wherein said load resistor is selectively variable.

37. Power source failure detecting means as claimed in claim 29, including indication means coupled to said one further electrode for providing an indication to the user of the power source of the drop of the voltage of said power source such that the voltage at the output of said voltage divider means falls below said predetermined detecting voltage.

38. Power source failure detecting means as claimed in claim 29, wherein said voltage divider means includes means for selectively adjusting division ratio thereof and therefore the fraction of the power source voltage appearing at said voltage divider output.

* * * * *